US006693495B1

(12) United States Patent
Wang

(10) Patent No.: US 6,693,495 B1
(45) Date of Patent: Feb. 17, 2004

(54) METHOD AND CIRCUIT FOR A CURRENT CONTROLLED OSCILLATOR

(75) Inventor: Chunyan Wang, Montréal (CA)

(73) Assignee: Valorbec, Limited Partnership, Montreal (CA)

( * ) Notice: Subject to any disclaimer, the term of this patent is extended or adjusted under 35 U.S.C. 154(b) by 0 days.

(21) Appl. No.: 10/218,454

(22) Filed: Aug. 15, 2002

(51) Int. Cl.[7] ................................................ H03L 7/00

(52) U.S. Cl. ..................... 331/36 C; 331/145; 331/153; 327/176; 327/205

(58) Field of Search .............................. 330/252–255, 330/258, 261, 263, 264, 267–269; 331/107 R, 108 R, 108 A, 108 C, 108 D, 36 C, 132, 145, 153; 327/164, 166, 172, 176, 205, 206

(56) References Cited

U.S. PATENT DOCUMENTS

| | | | |
|---|---|---|---|
| 4,147,996 A | 4/1979 | Gontowski, Jr. | |
| 4,205,279 A | 5/1980 | Beutler | |
| 4,236,121 A | 11/1980 | Senturia | |
| 4,283,690 A | 8/1981 | Tarbouriech | |
| 5,105,169 A | 4/1992 | Yamazaki et al. | |
| 5,491,456 A | 2/1996 | Kay et al. | |
| 5,748,050 A | 5/1998 | Anderson | |
| 5,764,110 A | * 6/1998 | Ishibashi | 331/57 |
| 5,783,953 A | 7/1998 | Bosnyak et al. | |
| 6,028,492 A | * 2/2000 | Matsubara | 331/111 |
| 6,163,226 A | 12/2000 | Jelinek et al. | |
| 6,198,358 B1 | 3/2001 | Tchamov et al. | |

OTHER PUBLICATIONS

IEEE 1987, Journal of Solid–State Circuits, vol. SC–22, No. 2, Apr. 1987 Design of PLL–Based Clock Generation Circuits, Deog–Kyoon Jeong et al. pp. 255–261.

IEEE, 1999, Differential 0.35 $\mu$m CMOS Circuits for 622MHz/933 MHz Monolithic Clock and Data Recovery Applications, H. Djahanshahi et al. Dept. of Electrical and Computer Engineering, University of Toronto, pp. II–93–II–96.

IEEE 1999, A Current–Controlled Oscillator Coarse–Steering Acquisition–Aid for High Frequency SOI CMOS PLL Circuits, Yi–Cheng Chang et al. Dept. of Electrical Engineering Arizona State University, pp. II–561–II–564.

\* cited by examiner

Primary Examiner—Timothy P. Callahan
Assistant Examiner—An T. Luu
(74) Attorney, Agent, or Firm—James Anglehart; Ogilvy Renault

(57) ABSTRACT

A current controlled oscillator is described comprising: a latch comprising two logic inverters to maintain a switch state for a determined duration, the latch having two complementary output voltages; a differential switch pair comprising a first and a second switch controlled by the two complementary output voltages respectively to steer a control current to a first and a second node alternatively; a third and fourth switch driven on by a high level voltage at one of the first and second node to set and reset the latch; and a fifth and sixth switch controlled by the two complementary output voltages respectively to pull down voltages at the first and second node alternatively, wherein the first and fifth switch are controlled by a same control signal and the second and sixth switch are controlled by a same control signal; whereby the frequency of switching is a function of the capacitance of the first and second node and the control current.

9 Claims, 2 Drawing Sheets

METHOD AND CIRCUIT FOR A CURRENT CONTROLLED OSCILLATOR

FIELD OF THE INVENTION

The invention relates to current-controlled oscillators. More specifically, it relates to a CMOS-latch-based switched-current oscillator circuit.

BACKGROUND OF THE INVENTION

Current-controlled Oscillator (ICO) circuits can be used for signal generation and detection in many signal processing systems. They are often needed in Phase-Locked Loop (PLL) circuits. ICO circuits operating in a very weak current range are very useful in optical-to-electrical conversion in high-performance and low-power optical signal detection circuits, as well as in current mirrors and current-mode A/D converters.

Existing current-controlled oscillators are usually based on multi-vibrators or ring oscillators, in which multiple stages of delay elements are included. Logic gates and operational amplifiers (OpAmp) are often used as such delay elements. In ICO circuits based on logic-gate-ring, the current available to charge or discharge a capacitance of one of the gates, or, each of the gates, is adjusted in order to change the frequency of oscillation [D. Jeong et al., "Design of PLL-based clock generation circuits," IEEE J. Solid State Circuits, Vol. SC-22, no. 2, April. 1987, pp 255–261.]. In this case, a current variation of several nano-Amperes may not be big enough to result in a significant change of the frequency.

In ICO circuits with delay elements based on OpAmps, the control current is used to adjust the circuit bias so that the gain of the OpAmps can be modified in order to adjust the frequency. In practical applications, the OpAmp-involved ICO can have drawbacks, for example, (a) the circuit structure are complex, (b) they may not function with a low supply voltage, e.g. below 1V, because the transistors, usually cascoded, need to be driven in the saturation region, and (c) they are not able to work properly when the control current is weak, e.g. in a nano-Ampere range. In most of the existing ICO, the sensitivity Kf, the ratio of frequency to current, is about several MHz per micro-Ampere or below.

Therefore, the functionality of most of the existing ICOs have a very limited sensitivity and range of the control current, as well as the supply voltages.

SUMMARY OF THE INVENTION

Accordingly, an object of the present invention is provide an ICO circuit with a simpler structure than that of the state of the art.

Another object of the present invention is to provide an ICO circuit with a higher sensitivity and a better ability to operate in a nano-Ampere range or below with a very low supply voltage.

Yet another object of the present invention is to provide an ICO with very low power dissipation.

According to a first broad aspect of the present invention, there is provided an oscillator circuit comprising: a latch comprising two logic inverters to maintain a switch state for a determined duration, the latch having two complementary output voltages; a differential switch pair comprising a first and a second switch controlled by the two complementary output voltages respectively to steer a control current to a first and a second node alternatively; a third and fourth switch driven on by a high level voltage at one of the first and second node to set and reset the latch; and a fifth and sixth switch controlled by the two complementary output voltages respectively to pull down voltages at the first and second node alternatively, wherein the first and fifth switch are controlled by a same control signal and the second and sixth switch are controlled by a same control signal; whereby the frequency of switching is a function of the capacitance of the first and second node and the control current.

Preferably, the first and second switches are PMOS transistors, the third, fourth, fifth, and sixth switches are NMOS transistors, and the logic inverters employed in the latch are complementary CMOS inverters.

According to a second broad aspect of the present invention, there is provided a method for current-controlled oscillation comprising: providing a latch to maintain a state for a determined duration and having two complementary output voltages; switching alternatively a control current from a first node to a second node representing a set and reset of said latch; and controlling said switching using said two complementary output voltages.

BRIEF DESCRIPTION OF THE DRAWINGS

These and other features, aspects and advantages of the present invention will become better understood with regard to the following description and accompanying drawings wherein.

DETAILED DESCRIPTION OF THE PREFERRED EMBODIMENT

Figure 1:
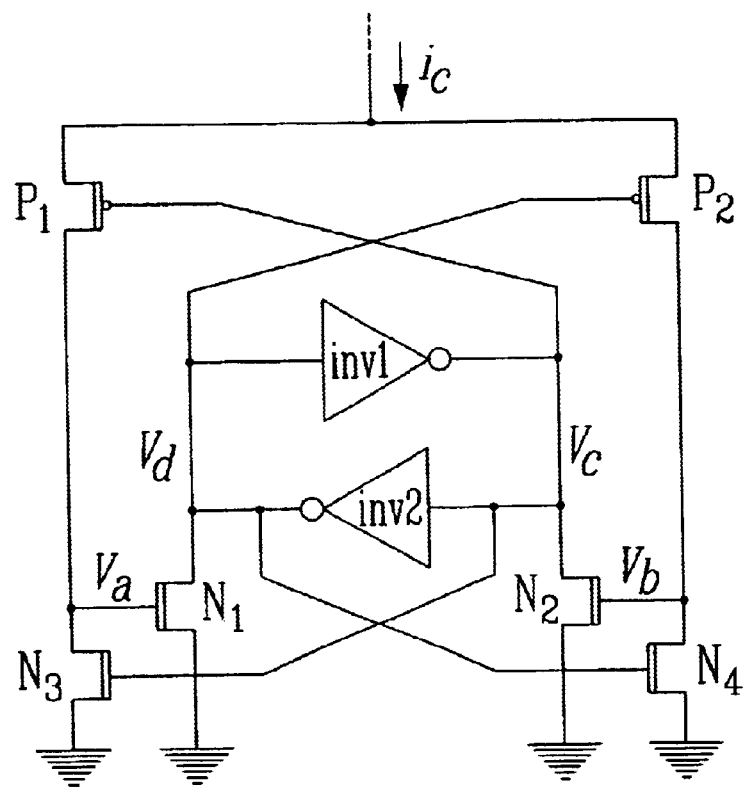
FIG. 1 is a circuit diagram of the current-controlled oscillator circuit.

In the ICO circuit, as illustrated in FIG. 1, two CMOS inverters constitute a latch. Two NMOS switches, N1 and N2, controlled by two voltages, $V_a$ and $V_b$, are used to set and reset the latch. Voltages $V_a$ and $V_b$ are established alternatively by the control current $i_c$ which is switched by a pair of differential PMOS, P1 and P2. The output signals of the ICO are the complementary voltages $V_c$ and $V_d$, which control the PMOS differential pair and, meanwhile, reset alternatively $V_a$ and $V_b$ through two NMOS transistors, N3 and N4.

Assume that the initial state of the latch is $V_c=0$ V and $V_d=VDD$, which means P1 and N4 are on while P2 and N3 are off. Thus, the current $i_c$ is switched, through P1, to the capacitor at the gate of N1 and $V_a$ is rising. Meanwhile, $V_b$ is pulled down by N4. When $V_a$ is high enough, N1 pulls $V_d$ down, which triggers the latch, changing its state to $V_c=VDD$ and $V_d=0$ V. In consequence, the current $i_c$ is then switched to the capacitor at the gate of N2. Now, $V_b$ will rise to reset $V_c$ to 0V and $V_a$ is pulled down by. N3. Therefore, the latch will change its state back to $V_c=0$ V and $V_d=VDD$.

It should be noted that,current $i_c$ is steered by the differential switch pair P1 and P2, to charge the gate capacitor of N1 or N2 alternatively so that the latch is set and reset alternatively, and voltages, $V_c$ and $V_d$, are complementary pulse signals.

The cycle time of the pulse signals, T, depends on the time required for $V_a$ or $V_b$ to be changed from zero to the level high enough to toggle the state of the latch. If the circuit structure and device parameters are determined, the frequency of the ICO will depend on the voltage rate $dV_a/dt=i_c/Ca$ and $dV_b/dt=i_c/Cb$, where Ca and Cb are the capacitances at node $V_a$ and $V_b$, respectively. As all the switches can be minimum-sized transistors, Ca, or Cb, is usually small, a small current variation of the control current can make a big change at the voltage rate. Thus, the frequency can be highly sensitive to the current variation. This feature implies also that the decrease of transistor feature size leads to a decrease of Ca and Cb, i.e., an increase of the sensitivity of the ICO to the control current.

Six MOS switches are used to switch the control current and discharging currents. All these switches are controlled by the voltage signals generated in the circuit. The circuit is, in fact, a switched-current circuit operating without any external control signals.

The latch is triggered by the gradually varying $V_a$ and $V_b$, however, the rise/fall time of the output voltages, $V_c$ and $V_d$, is determined mainly by the latch and is not proportional to the control current. Therefore, an extremely weak $i_c$ is able to drive the ICO without affecting the transient time of the output voltages.

Figure 2:
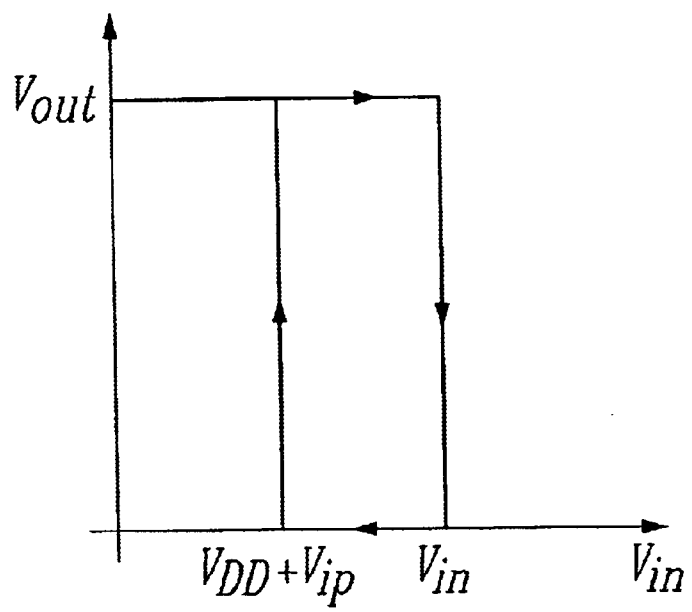
FIG. 2 is the voltage transfer characteristic of the inverters employed in the current-controlled oscillator.

It should also be noted that the proposed ICO operates with a supply voltage (VDD) lower than $(V_{tn}+|V_{tp}|)$, where $V_{tn}$ and $V_{tp}$ are, respectively, the threshold voltages of the NMOS and PMOS of the inverters. If VDD $>(V_{tn}+|V_{tp}|)$, the circuit may have an unstable equilibrium when $V_c$ and $V_d$ are both at the level of the threshold voltage of the inverters. In this case, all the MOS switches are turned on, and $i_c$ is divided by the two PMOS switches. Such a state may be terminated by some random excitations, such as a heat agitation, and the duration of such a state is thus out of control. If VDD$<(V_{tn}+|V_{tp}|)$, the inverters have a voltage transfer characteristic with hysteresis as shown in FIG. 2. In this case, the two transistors in each inverter will never be turned on simultaneously and, thus, the state of the unstable equilibrium is eliminated.

Unlike odd-number-gate ring oscillators or OpAmp-based multi-vibrators, the new ICO has a small number of minimum-sized transistors, occupying a very small silicon area. The power dissipation of the ICO circuit is very low because of the simple circuit structure and the low supply voltage.

This new ICO circuit is particularly interesting for optical-to-electrical conversion. An incident light can be converted linearly into a current and then the current can be converted, by the ICO, into a voltage signal of which the frequency is proportional to the incident optical power. This approach provides an efficient solution to the infamous problem of range-sensitivity conflict in the sensor design. On one hand, its high sensitivity of the frequency to the input current of the ICO makes the optical-to-electrical conversion circuit highly sensitive to a weak optical input that yields a very weak current. On the other hand, as the information at the output is carried by the cycle duration, instead of the voltage magnitude, the dynamic range of the circuit is not limited by the supply voltage and the transistor operation modes. This feature is particularly significant when the circuit is fabricated in a deep-sub-micron process and has to operate under a low supply voltage condition.

Figure 3:
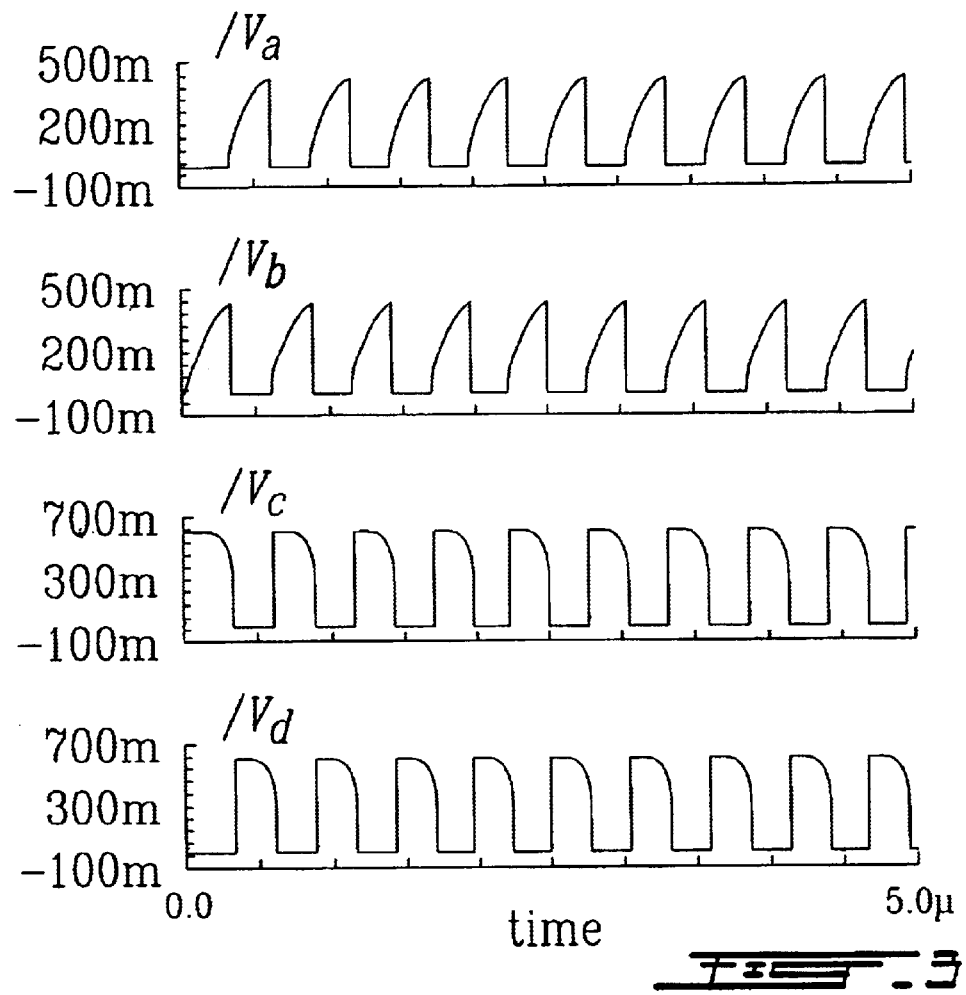
FIG. 3 is simulation waveforms of the current-controlled oscillator.

FIG. 3 shows simulation results of an ICO using transistor models of a 0.18 micron technology. All the transistors are minimum-sized. The waveforms of the signals, when the control current $i_c=2$ nA and the supply voltage VDD=0.6V, are shown in the figure.

Figure 4:
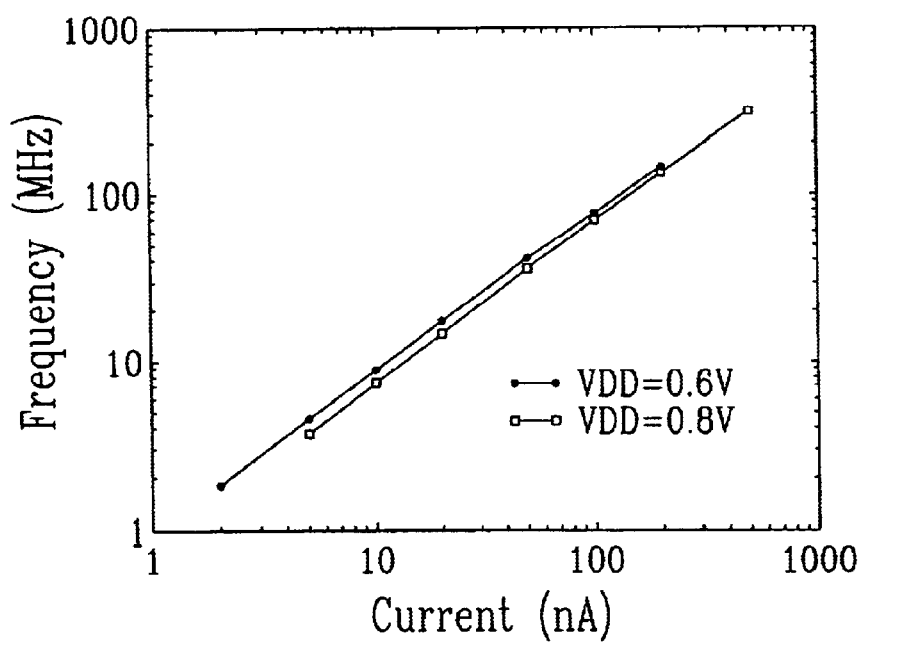
FIG. 4 is a frequency versus current characteristic graph.

FIG. 4 illustrates the frequency-versus-current characteristics of the circuit. Due to the limitation of appropriate use of the transistor models, the minimal value of $i_c$ is 2 nA in the simulation. However, in practice, the control current can be much lower. The sensitivity of the ICO is about 0.7 MHz/nA. The power dissipation of the circuit depends on the frequency of the output voltage and it is 0.7 micro Watts when the output frequency is about 140 MHz.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

What is claimed is:

1. An oscillator circuit comprising:

a latch comprising two logic inverters to maintain a switch state for a determined duration, said latch having two complementary output voltages;

a differential switch pair comprising a first and a second switch controlled by said two complementary output voltages respectively to steer a control current to a first and a second node alternatively;

a third and fourth switch driven on by a high level voltage at one of said first and second node to set and reset said latch; and a fifth and sixth switch controlled by said two complementary output voltages respectively to pull down voltages at said first and second node alternatively, wherein said first and fifth switch are controlled by a same control signal and said second and sixth switch are controlled by a same control signal;

whereby a frequency of switching of said oscillator circuit is a function of a capacitance of said first and second node and said control current.

2. A circuit as claimed in claim 1, wherein said latch is a CMOS latch composed of two inverters.

3. A circuit as claimed in claim 2, wherein said two inverters are each composed of an NMOS and a PMOS transistor.

4. A circuit as claimed in claim 1, wherein said differential switch pair comprises two PMOS transistors.

5. A circuit as claimed in claim 1, wherein said third, fourth, fifth and sixth switch are NMOS transistors.

6. A circuit as claimed in claim 1, wherein ten minimum-sized transistors are used.

7. A circuit as claimed in claim 2, wherein each of said two inverters has a voltage transfer characteristic with hysteresis.

8. A circuit as claimed in claim 3, further comprising a supply voltage lower than a sum of a threshold voltage of said NMOS and said PMOS transistor of said two inverters.

9. A method for current-controlled oscillation comprising:

providing a latch comprising two logic inverters to maintain a state for a determined duration and having two complementary output voltages;

switching alternatively a control current from a first node to a second node representing a set and reset of said latch; and controlling said switching using said two complementary output voltages.

* * * * *